United States Patent
Bae

(10) Patent No.: US 6,242,960 B1
(45) Date of Patent: Jun. 5, 2001

(54) INTERNAL CLOCK SIGNAL GENERATING CIRCUIT EMPLOYING PULSE GENERATOR

(75) Inventor: Il-man Bae, Suwon (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/516,882

(22) Filed: Mar. 1, 2000

(30) Foreign Application Priority Data

Apr. 8, 1999 (KR) ................................................ 99-12322

(51) Int. Cl.[7] ...................................................... G06F 1/04
(52) U.S. Cl. ............................ 327/299; 327/154; 327/175
(58) Field of Search .................................... 327/291, 299, 327/141, 154, 161, 162, 172, 175, 211, 212

(56) References Cited

U.S. PATENT DOCUMENTS

| 5,264,737 | * | 11/1993 | Oikawa | 327/172 |
| 5,396,110 | * | 3/1995 | Houston | 327/172 |
| 5,600,274 | * | 2/1997 | Houston | 327/262 |

* cited by examiner

Primary Examiner—Toan Tran
Assistant Examiner—Cassandra Cox
(74) Attorney, Agent, or Firm—F. Chau & Associates, LLP

(57) ABSTRACT

The internal clock signal generating circuit of the present invention includes a pulse generation circuit for receiving a reference clock signal which is generated in response to an external clock signal, and generating an internal clock signal. The pulse generation circuit includes a pulse generation unit for generating a pulse signal which is activated in response to a rising edge of a first delay signal obtained by delaying the reference clock signal by a first delay time, and deactivated in response to a falling edge of a second delay signal obtained by delaying the reference clock signal by a second delay time which is shorter than the first delay time, and a driving unit for generating the internal clock signal which is activated in response to a falling edge of the reference clock signal and deactivated in response to a rising edge of the pulse signal.

18 Claims, 4 Drawing Sheets

INTERNAL CLOCK SIGNAL GENERATING CIRCUIT EMPLOYING PULSE GENERATOR

BACKGROUND OF THE INVENTION

1. Field of the Invention

The present invention relates to a synchronous dynamic random access memory (SDRAM), and more particularly, to a circuit for generating an internal clock signal synchronized with an external clock signal for use in SDRAMs.

2. Description of the Related Art

In synchronous dynamic random access memories (SDRAMs), control signals for data input and output are generated based on an external clock signal which is provided by an external system. In particular, internal signals of an SDRAM are generated based on an internal clock signal which is obtained from an external clock signal provided by an external system. Thus, control signals for data input/output operation in an SDRAM is generated based on the internal clock signal, which may be a pulse signal.

Generally, an internal clock signal generating circuit has several delay units. The delay units are used to activate an internal clock signal for a predetermined period of time and then deactivate the internal clock signal. That is, the internal clock signal is activated in response to a leading edge of an external clock signal and deactivated in response to a pulse signal obtained by delaying the external clock signal for a predetermined period of time using the delay units. The width of an activation period of the internal clock signal is determined by the amount of time for which the delay units delay the internal clock signal. Also, in SDRAMs, it is desirable that the activation period of the internal clock signal is long enough to provide a margin between internal signals in an SDRAM. Thus, delay times of the delay units should be greater than or equal to a predetermined period of time.

However, a conventional internal clock signal generating circuit has a problem in that an internal clock signal can be falsely or not generated when an external clock signal has an activation period which is shorter than required. For example, an internal clock signal is generated in synchronization with an external clock signal, that is, one cycle of the internal clock signal should be generated in response to every cycle of the external clock signal. When an external clock signal having an activation period which departs from a predetermined value, due to factors such as noise generated in a system, is applied to a memory device, a corresponding internal clock cycle may not be generated before the start of a next cycle of the external clock signal. As a result, the internal clock signal may not be generated corresponding to every cycle of the external clock signal. Thus, the internal clock signal is not synchronized with the external clock signal.

There is another problem in that an internal clock signal generated by a conventional internal clock signal generating circuit is not synchronized with an external clock signal when an activation period of the external clock signal becomes shorter than normal, a condition possibly caused by high-speed operation of the system.

Therefore, it is desired that a frequency characteristic of an internal clock signal generating circuit is improved so that the internal clock signal generating circuit can be applied to a system which operates at high frequencies.

SUMMARY OF THE INVENTION

An object of the present invention is to provide a circuit for generating an internal clock signal synchronized with an external clock signal for use in a memory device.

To achieve the above and other objects, the present invention provides a circuit for generating an internal clock signal, including a pulse generation circuit for receiving a reference clock signal which is obtained from and synchronized with an external clock signal, and generating an internal clock signal. The pulse generation circuit includes a pulse generation unit for generating a pulse signal which is activated in response to a rising edge of a first delay signal obtained by delaying the reference clock signal by a first delay time, and deactivated in response to a falling edge of a second delay signal obtained by delaying the reference clock signal by a second delay time which is shorter than the first delay time, and a driving unit for generating the internal clock signal which is activated in response to a falling edge of the reference clock signal and deactivated in response to a rising edge of the pulse signal. The pulse generation unit includes a first delay unit for receiving and delaying the reference clock signal by the first delay time to generate the first delay signal, a second delay unit for receiving and delaying the reference clock signal by the second delay time to generate the second delay signal, and a logic unit receiving the first and second delay signals from the first and second delay units, respectively, for performing a predetermined logic operation with respect to the first and second delay signals to generate the automatic pulse signal. The first and second delay units are configured such that the difference between the first delay time in the first delay unit and the second delay time in the second delay unit is less than an activation period of the external clock signal. The driving unit also includes a pull-up unit for activating the internal clock signal in response to the reference clock signal and the automatic pulse signal, and a pull-down unit for deactivating the internal clock signal in response to the automatic pulse signal.

The internal clock signal generating circuit with the above features according to the present invention can generate a normal internal clock signal even if it is applied to a system which operates at high speed.

BRIEF DESCRIPTION OF THE DRAWINGS

The above and other objects and advantages of the present invention will become more apparent by describing in detail preferred embodiments thereof with reference to the attached drawings in which.

DESCRIPTION OF PREFERRED EMBODIMENTS

The attached drawings are for illustrating exemplary embodiments of the present invention, and the contents of the attached drawings should be referred to in order to gain a sufficient understanding of the merits of the present invention and the operation thereof and the objectives accomplished by the operation of the present invention.

Figure 1:
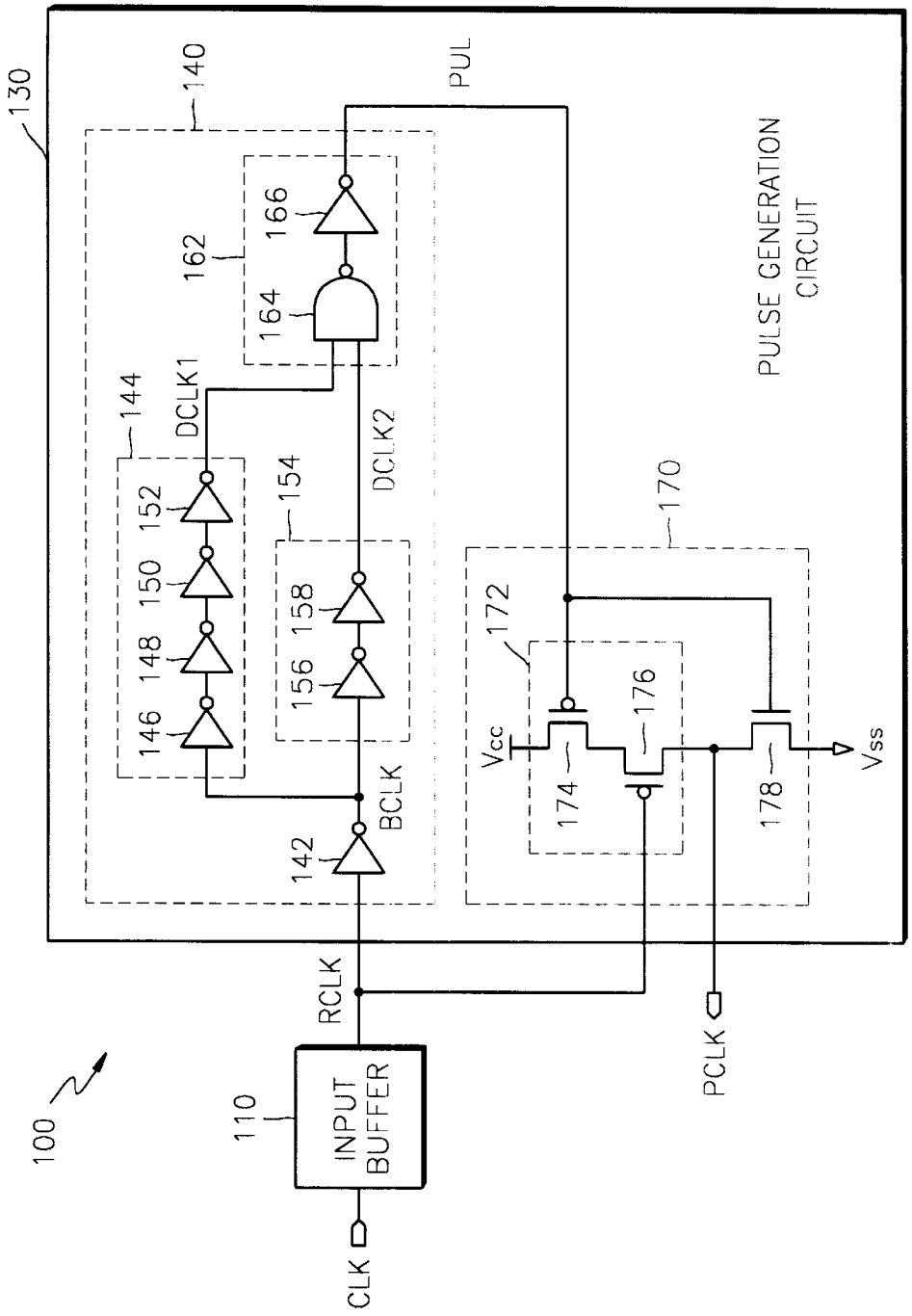
FIG. 1 is a circuit diagram illustrating an internal clock signal generating circuit according to an embodiment of the present invention.
Figure 2:
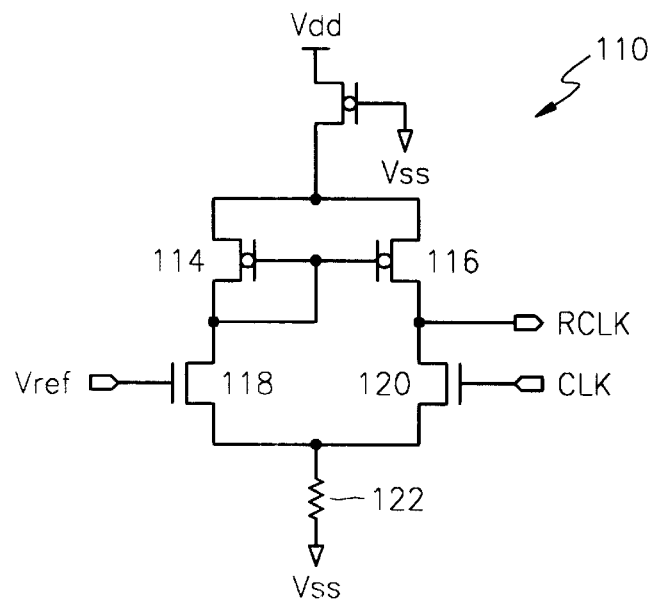
FIG. 2 is a circuit diagram of the input buffer shown in FIG. 1.
Figure 3:
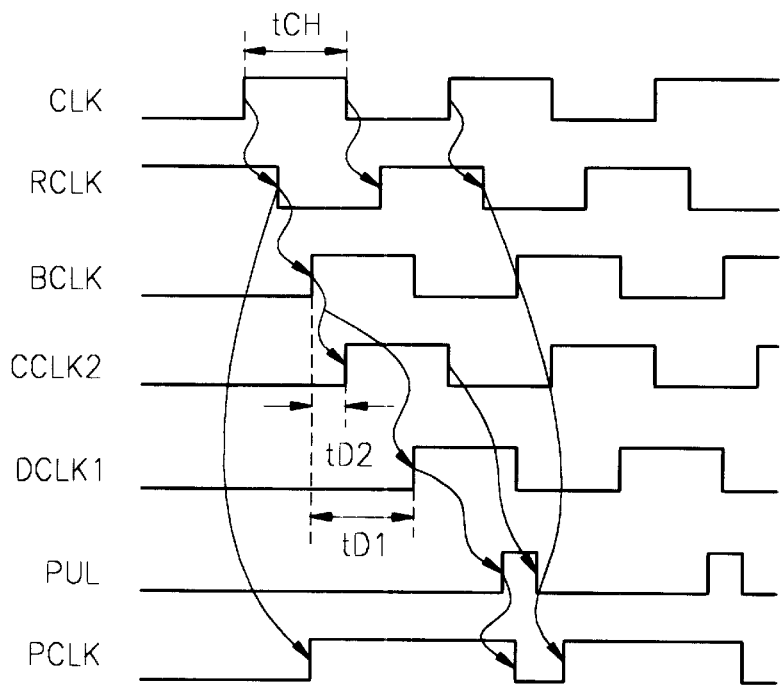
FIG. 3 is a timing diagram of signals used and generated in the internal clock signal generating circuit shown in FIG. 1.
Figure 4:
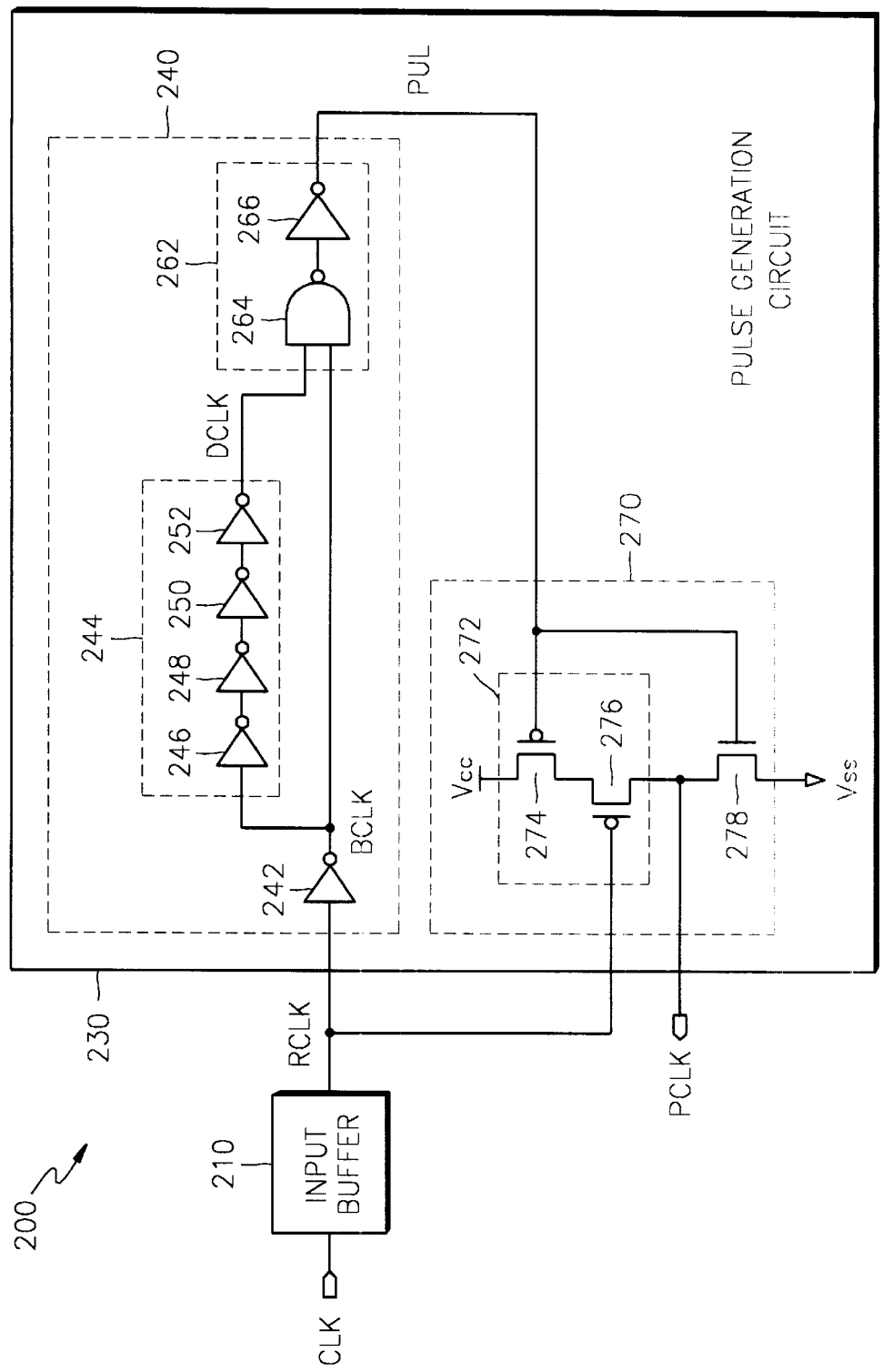
FIG. 4 is a circuit diagram illustrating a comparative embodiment of the internal clock signal generating circuit in FIG. 1.
Figure 5:
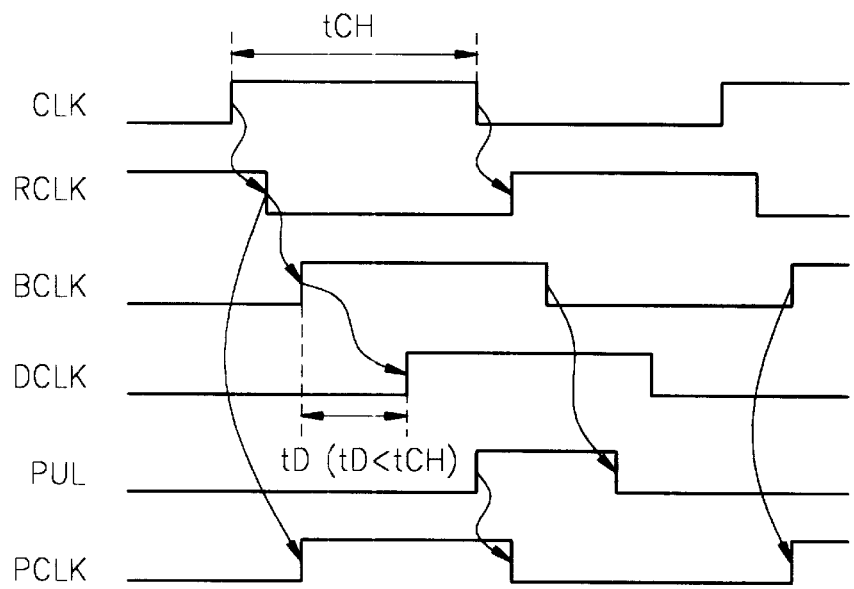
FIG. 5 is a timing diagram of signals used and generated in the internal clock signal generating circuit shown in FIG. 4, to which an external clock signal having a low frequency is input.
Figure 6:
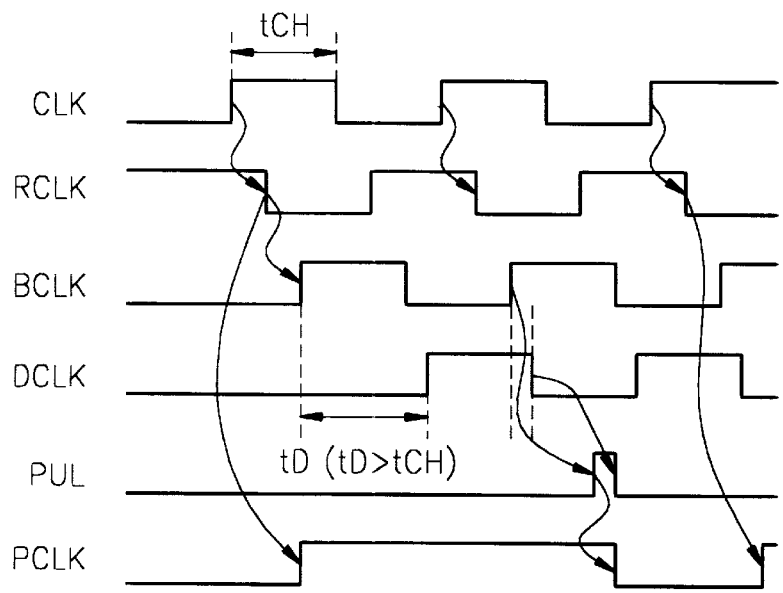
FIG. 6 is a timing diagram of signals used and generated in the internal clock signal generating circuit shown in FIG. 4, to which an external clock signal having a high frequency is input.

Hereinafter, the present invention will be described in detail by explaining preferred embodiments of the present invention with reference to the attached drawings. FIGS. 1 through 3 illustrate a preferred embodiment of the present invention, and FIGS. 4 through 6 illustrate a comparative embodiment to be compared with the embodiment in FIG. 1.

Embodiment

Referring to FIG. 1, an internal clock signal generating circuit 100 according to an embodiment of the present invention includes an input buffer 110 and a pulse generation circuit 130. The input buffer 110 converts the level of an external clock signal CLK acting as a reference signal of a memory device into a complementary metal oxide semiconductor (CMOS) level, and generates a reference clock signal RCLK. The reference clock signal RCLK is obtained by delaying the external clock signal CLK for a predetermined period of time and inverting the delayed external clock signal.

The pulse generation circuit 130 receives the reference clock signal RCLK from the input buffer 110 and generates an internal clock signal PCLK. The pulse generation circuit 130 includes a pulse generation unit 140 and a driving unit 170. The pulse generation unit 140 generates an automatic pulse signal PUL which is activated in response to the reference clock signal RCLK. Preferably, the pulse generation unit 140 includes first and second delay units 144 and 154 and a logic circuit unit 162. The pulse generation unit 140 may further include an inverting unit 142.

The inverting unit 142 receives and inverts the reference clock signal RCLK and generates an inverted clock signal BCLK. Preferably, an operation of the inverting unit 142 may be implemented with an inverter. The inverting unit 142 inverts the phase of the reference clock signal RCLK. However, it is apparent to those skilled in the art that an embodiment of the present invention may be accomplished without the inverting unit 142.

The first delay unit 144 receives the inverted clock signal BCLK and generates a first delayed clock signal DCLK1. The first delayed clock signal DCLK1 is obtained by delaying the inverted clock signal BCLK by a first delay time tD1. Preferably, the first delay unit 144 includes a plurality of inverters 146, 148, 150 and 152 each having a predetermined delay time, and determines the first delay time tD1.

The second delay unit 154 receives the inverted clock signal BCLK and generates a second delayed clock signal DCLK2. The second delayed clock signal DCLK2 is obtained by delaying the inverted clock signal BCLK by a second delay time tD2. Preferably, the second delay unit 154 includes a plurality of inverters 156 and 158 each having a predetermined delay time. The second delay time tD2 is determined by the plurality of inverters 156 and 158 and is different from the first delay time tD1. Preferably, the second delay unit 154 is configured such that the second delay time tD2 is shorter than the first delay time tD1, i.e., tD2<tD1. This is achieved when the number of inverters 156 and 158 in the second delay unit 154 is smaller than the number of inverters 146, 148, 150 and 152 in the first delay unit 144 as shown in FIG. 1, or when sizes of transistors constituting the inverters 156 and 158 in the second delay unit 154 are smaller than those of transistors constituting the inverters in the first delay unit 144. More preferably, the delay time difference (tD1−tD2) between the first and second delay units 144 and 154 is smaller than an activation period tCH (see FIG. 3) of the external clock signal CLK. For example, when the activation period tCH of the external clock signal CLK is about 3 ns and the first delay time tD1 is kept between 2 ns and 3 ns, the second delay unit 154 is configured to have the second delay time tD2 of about 0.5 ns. Also, since the width of an activation period of the internal clock signal PCLK is determined by the first delay time tD1, the first delay unit 144 is configured so that the first delay time tD1 is greater than or equal to a predetermined time.

The logic unit 162 generates the automatic pulse signal PUL which is activated to a logic high level when the first and second delayed clock signals DCLK1 and DCLK2 are at a logic high level. Preferably, the logic unit 162 includes a NAND gate 164 and an inverter 166.

The driving unit 170 receives the reference clock signal RCLK from the input buffer 110 and the automatic pulse signal PUL from the pulse generation unit 140, and generates the internal clock signal PCLK. The internal clock signal PCLK is activated in response to a falling edge of the reference clock signal RCLK and deactivated in response to a rising edge of the automatic pulse signal PUL. The driving unit 170 includes a pull-up unit 172 and a pull-down unit 178. The pull-up unit 172 outputs the internal clock signal PCLK of a logic high level in response to the automatic pulse signal PUL and the reference clock signal RCLK. Preferably, the pull-up unit 172 includes a first p-channel MOS (PMOS) transistor 174 which is controlled by the automatic pulse signal PUL, and a second PMOS transistor 176 which is controlled by the reference clock signal RCLK. The pull-down unit 178 pulls down the internal clock signal PCLK to a logic low level in response to the activation of the automatic pulse signal PUL to a logic high level. Preferably, the pull-down unit 178 includes an n-channel MOS (NMOS) transistor which is controlled by the automatic pulse signal PUL.

FIG. 2 is a circuit diagram of the input buffer 110 of FIG. 1. As shown in FIG. 2, the input buffer 110 according to an embodiment of the present invention is configured to be a differential amplifier, and generates the reference clock signal RCLK in response to rising and falling of a level of the external clock signal CLK against a reference voltage Vref level. The reference clock signal RCLK may be obtained by delaying the external clock signal CLK for a predetermined period of time and inverting the delayed external clock signal CLK. The input buffer 110 preferably includes first and second loading devices 112 and 122, first and second PMOS transistors 114 and 116, and first and second NMOS transistors 118 and 120. The sources of the first and second PMOS transistors 114 and 116 are commonly connected to a power supply voltage Vdd via the first loading device 112, and the gates of the first and second PMOS transistors 114 and 116 are commonly connected to the drain of the first NMOS transistor 118. The drains of the first and second NMOS transistors 118 and 120 are connected to the drains of the first and second PMOS transistors 114 and 116, respectively. The sources of the first and second NMOS transistors 118 and 120 are connected to a ground voltage Vss via the second loading device 122. The first NMOS transistor 118 is controlled by the reference voltage Vref, and the second NMOS transistor 120 is controlled by the external clock signal CLK.

The input buffer 110 generates the reference clock signal RCLK of a logic low level when the level of the external clock signal CLK exceeds the level of the reference voltage Vref, and generates the reference clock signal RCLK of a logic high level when the level of the external clock signal CLK falls below the level of the reference voltage Vref. The input buffer 110 can be realized with logic circuits, such as inverters and logic gates, instead of the configuration of a differential amplifier shown in FIG. 2.

FIG. 3 is a timing diagram of signals used and generated in the internal clock signal generating circuit 100 shown in FIG. 1. Referring to FIG. 3, upon receiving an external clock signal CLK having a predetermined period, particularly, a constant activation period tCH, the input buffer 110 delays the external clock signal CLK for a predetermined time period and inverts the phase of the external clock signal CLK to generate a reference clock signal RCLK. When the external clock signal CLK maintains a logic low level, the input buffer 110 generates the reference clock signal RCLK of a logic high level. At that time, the pulse generation circuit 140 receiving the reference clock signal RCLK generates the automatic pulse signal PUL of a logic low level to turn on the first PMOS transistor 174 in the pull-up unit 172 (the generation of the automatic pulse signal PUL will be described in detail below). When the external clock signal CLK is changed to a logic high level, the reference clock signal RCLK is changed to a logic low level so as to turn on the second PMOS transistor 176 in the pull-up unit 172. Consequently, the driving unit 170 generates an internal clock signal PCLK of a logic high level. That is, the internal clock signal PCLK is changed to a logic high level in response to the rising edge of the external clock signal CLK.

The inverting unit 142 receives the reference clock signal RCLK of the logic low level generated in response to the rising edge of the external clock signal CLK, and delays the reference clock signal RCLK for a predetermined period of time. After inverting the delayed reference clock signal, the inverting unit 142 generates the inverted signal as an inverted clock signal BCLK. The inverted clock signal BCLK is then transmitted to the first and second delay units 144 and 154. The first delay unit 144 delays the inverted clock signal BCLK by the first delay time tD1 to generate a first delayed clock signal DCLK1. The second delay unit 154 delays the inverted clock signal BCLK by the second delay time tD2 to generate a second delayed clock signal DCLK2. Upon receiving the first and second delayed clock signals DCLK1 and DCLK2, the logic unit 162 generates the automatic pulse signal PUL which is activated when the first and second delayed clock signals DCLK1 and DCLK2 are both at a logic high level. The automatic pulse signal PUL is activated in response to the rising edge of the first delayed clock signal DCLK1, and deactivated in response to the falling edge of the second delayed clock signal DCLK2. The NMOS transistor in the pull-down unit 178 is turned on in response to the rising edge of the automatic pulse signal PUL, and accordingly, the internal clock signal PCLK is deactivated.

Consequently, in the internal clock signal generating circuit 100 according to the present invention, the internal clock signal PCLK is changed to a logic high level in response to the rising edge of the external clock signal CLK, and changed to a logic low level in response to the rising edge of the automatic pulse signal PUL generated by delaying the external clock signal CLK for a predetermined period of time.

According to the present invention as described above, the difference between the delay times (tD1–tD2) of the first and second delay units 144 and 154 is smaller than the activation period tCH of the external clock signal CLK. In other words, when the external clock signal CLK has a high frequency so that the activation period tCH becomes small, the delay time difference (tD1–tD2) between the first and second delay units 144 and 154 may be reduced by increasing the delay time tD2 of the second delay unit 154. Due to the reduction of the delay time difference (tD1–tD2), the automatic pulse signal PUL is generated every cycle of the first and second delayed clock signals DCLK1 and DCLK2 in response to the first and second delayed clock signals DCLK1 and DCLK2. Therefore, even if the internal clock signal generating circuit 100 according to the present invention is applied to a system which operates at high speed, a normal internal clock signal can be generated. This effect of the present invention will be more apparent through the following comparative embodiment.

Comparative Embodiment

FIG. 4 is a circuit diagram illustrating a comparative embodiment with respect to the internal clock signal generating circuit 100 of FIG. 1. An internal clock signal generating circuit 200 of FIG. 4 has the same configuration as the internal clock signal generating circuit 100 of FIG. 1 except that the internal clock signal generating circuit 200 of FIG. 4 does not have the second delay unit 154 of FIG. 1.

Referring to FIG. 4, the internal clock signal generating circuit 200 includes an input buffer 210 and a pulse generation circuit 230. The pulse generation circuit 230 includes a pulse generation unit 240 and a driving unit 270. The pulse generation unit 240 includes an inverting unit 242, a delay unit 244, and a logic unit 262. The driving unit 270 includes a pull-up unit 272 and a pull-down unit 278.

The configuration of the input buffer 210, the inverting unit 242, the delay unit 244, the logic unit 262, the pull-up unit 272 and the pull-down unit 278 is the same as that of the input buffer 110, inverting unit 142, first delay unit 144, logic unit 162, pull-up unit 172 and pull-down unit 178 of FIG. 1, so that the same configuration will not be described again.

FIG. 5 is a timing diagram of signals used and generated in the internal clock signal generating circuit 200 of FIG. 4, which receives an external clock signal CLK having a low frequency and generates a normal internal clock signal PCLK. FIG. 6 is a timing view of signals used and generated in the internal clock signal generating circuit 200 of FIG. 4, which receives an external clock signal CLK having a high frequency and generates an abnormal internal clock signal PCLK.

Referring to FIG. 5, when the input buffer 210 receives an external clock signal CLK having a low frequency, for example, an external clock signal CLK having an activation period tCH that is longer than a delay time tD of the delay unit 244, the input buffer 210 generates a reference clock signal RCLK by delaying the external clock signal CLK for a predetermined period of time and inverting the phase of the external clock signal CLK. At that time, the pulse generation circuit 230 generates an internal clock signal PCLK that is activated to a logic high level in response to the reference clock signal RCLK.

The reference clock signal RCLK is again delayed for a predetermined period of time and phase-inverted by the inverting unit 242, and is generated as an inverted clock signal BCLK. The delay unit 244 delays the inverted clock signal BCLK by a delay time tD to generate a delayed clock signal DCLK. The logic unit 262 then generates an automatic pulse signal PUL in response to the inverted clock signal BCLK from the inverting unit 242 and the delayed clock signal DCLK from the delay unit 244. Here, since the delay time tD is shorter than the activation period tCH of the external clock signal CLK, a pulse of the automatic pulse signal PUL is generated every period of the external clock signal CLK. The driving unit 270 then generates the internal clock signal PCLK that is deactivated in response to the rising edge of the automatic pulse signal PUL.

As described above, when the external clock signal CLK having a low frequency is received, the internal clock signal PCLK is activated to a logic high level in response to the rising edge of the external clock signal CLK, and the internal clock signal PCLK is deactivated to a logic low level in response to the automatic pulse signal PUL formed by delaying the external clock signal CLK for a predetermined period of time, as in the embodiment of FIG. 1 of the present invention.

However, as shown in FIG. 6, when a high-frequency external clock signal CLK is input, the activation period tCH of the external clock signal CLK is shorter than the delay time tD of the delay unit 244, and the automatic pulse signal PUL is not generated within a period of the inverted clock signal BCLK. That is, the automatic pulse signal PUL is generated in response to the rising edge of the second cycle of the inverted clock signal BCLK. Then, the internal clock signal PCLK is deactivated in response to the rising edge of the automatic pulse signal PUL.

Accordingly, in the internal clock signal generating circuit 200 of FIG. 4, when the external clock signal CLK of a low frequency is used, an internal clock signal PCLK is generated in synchronization with the external clock signal CLK. However, when the external clock signal CLK of a high frequency, for example, an external clock signal CLK having an activation period tCH which is shorter than the delay time tD of the delay unit 244, is used, an abnormal internal clock signal PCLK which is not synchronized with the external clock signal CLK is generated.

For example, assuming that the delay unit 244 has a delay time tD of about 3 ns, when an external clock signal CLK having a low frequency, for example, an activation period tCH of about 5 ns or longer, is input, an automatic pulse signal PUL having a width of 2 ns is generated, and the internal clock signal PCLK is deactivated in response to the rising edge of the automatic pulse signal PUL. Here, the width of 2 ns corresponds to the difference (tCH−tD) between the activation period tCH and the delay time tD.

However, when the external clock signal CLK having a high frequency, for example, an activation period tCH of about 3 ns or shorter, is input, a case does not occur during a period of the external clock signal CLK in which the two input signals of the NAND gate 264 in the logic unit 262 are both at a logic high level. Accordingly, the automatic pulse signal PUL is not generated within the period of the external clock signal CLK, and consequently, the internal clock signal PCLK is not deactivated within the period of the external clock signal CLK.

Compared with the internal clock signal generating circuit 200 of FIG. 4, the internal clock signal generating circuit 100 of FIG. 1 generates the internal clock signal PCLK synchronized with the external clock signal CLK even when the external clock signal CLK having a high frequency is used.

Although the present invention has been described with reference to particular embodiments, it will be apparent to one of ordinary skill in the art that modifications of the described embodiments may be made without departing from the spirit and scope of the invention. For example, this disclosure describes in the embodiment in FIG. 1 a case in which the phase of the reference clock signal RCLK is opposite to that of the external clock signal CLK, and the inverting unit 142 for inverting the phase of the reference clock signal RCLK is included in the pulse generation unit 140. However, when a reference clock signal RCLK having the same phase as that of the external clock signal CLK is generated by the input buffer 110, the inverting unit 142 may not be included in the pulse generation unit 140. In this case, the delayed clock signals of the first and second delay units 144 and 154 are generated in response to the reference clock signal RCLK.

It is therefore to be understood that, within the scope of the appended claims, the present invention can be practiced in a manner other than as specifically described herein.

What is claimed is:

1. A circuit for generating an internal clock signal synchronized with an external clock signal, the circuit comprising:

a pulse generation unit for receiving a reference clock signal synchronized with the external clock signal and for generating a pulse signal activated in response to a rising edge of a first delay signal obtained by delaying the reference clock signal by a first delay time, and deactivated in response to a falling edge of a second delay signal obtained by delaying the reference clock signal by a second delay time, the second delay time being shorter than the first delay time; and a driving unit for generating the internal clock signal which is activated in response to a falling edge of the reference clock signal and deactivated in response to a rising edge of the pulse signal.

2. The circuit of claim 1, wherein the pulse generation unit comprises:

a first delay unit receiving the reference clock signal, for delaying the reference clock signal by the first delay time to generate the first delay signal;

a second delay unit receiving the reference clock signal, for delaying the reference clock signal by the second delay time to generate the second delay signal; and a logic unit receiving the first and second delay signals from the first and second delay units, respectively, for performing a predetermined logic operation with respect to the first and second delay signals to generate the pulse signal.

3. The circuit of claim 2, wherein the pulse signal generated from the logic unit is activated in response to an activation of the first and second delay signals generated from the first and second delay units, respectively.

4. The circuit of claim 2, wherein the first and second delay units include inverters, the number of inverters in the first delay unit is different from the number of inverters in the second delay unit.

5. The circuit of claim 2, wherein a difference between the first delay time in the first delay unit and the second delay time in the second delay unit is less than an activation period of the external clock signal.

6. The circuit of claim 1, wherein the driving unit comprises:

a pull-up unit for activating the internal clock signal in response to the reference clock signal and the pulse signal; and a pull-down unit for deactivating the internal clock signal in response to the pulse signal.

7. The circuit of claim 1, further including a buffer circuit receiving the external clock signal, for changing a level of the external clock signal to a complementary metal oxide semiconductor (CMOS) level to generate the reference clock signal.

8. A circuit for receiving an external clock signal and generating an internal clock signal synchronized with the external clock signal, comprising:

a buffer circuit receiving the external clock signal and a reference voltage, for changing a level of the external clock signal based on the reference voltage to generate a reference clock signal;

a pulse generation unit receiving the reference clock signal, for separately delaying the reference clock signal by a first delay time and a second delay time to generate a pulse signal, wherein the pulse signal is activated in response to an activation of reference clock signals separately delayed by the first and second delay times; and a driving unit receiving the reference clock signal from the buffer circuit and the pulse signal from the pulse generation unit, for generating the internal clock signal that is activated in response to the reference clock signal and the pulse signal and deactivated in response to the pulse signal.

9. The circuit of claim 8, wherein the buffer circuit generates the reference clock signal having a first logic level when the level of the external clock signal exceeds the reference voltage, and generates the reference clock signal having a second logic level when the level of the external clock signal falls below the reference voltage.

10. The circuit of claim 8, wherein the pulse generation unit includes:

a first delay unit receiving the reference clock signal from the buffer circuit, for delaying the reference clock signal by a first delay time to generate a first delay signal;

a second delay unit receiving the reference clock signal from the buffer circuit, for delaying the reference clock signal by a second delay time to generate a second delay signal; and logic unit receiving the first and second delay signals from the first and second delay units, respectively, for performing a predetermined logic operation with respect to the first and second delay signals to generate the pulse signal, wherein the pulse signal is activated in response to an activation of the first and second delay signals.

11. The circuit of claim 10, wherein the first delay time in the first delay unit is longer than the second delay time in the second delay unit.

12. The circuit of claim 11, wherein the external clock signal has an activation period that is longer than a difference between the first delay time and the second delay time.

13. The circuit of claim 10, wherein the pulse signal generated from the logic unit is activated in response to an activation of the first delay signal, and deactivated in response to an deactivation of the second delay signal.

14. The circuit of claim 8, wherein the driving unit includes:

a pull-up unit receiving the reference clock signal and the pulse signal, for activating the internal clock signal in response to the reference clock signal and the pulse signal; and a pull-down unit receiving the reference clock signal, for deactivating the internal clock signal in response to the pulse signal.

15. The circuit of claim 14, wherein the pull-up unit activates the internal clock signal in response to a deactivation of the reference clock signal when the pulse signal is inactive.

16. The circuit of claim 15, wherein the pull-up unit includes:

a first transistor of which electrical conduction is controlled by the pulse signal; and a second transistor of which electrical conduction is controlled by the reference clock signal, wherein the second transistor has an electrical conduction path of which one end is connected to the first transistor and the other end generates the internal clock signal.

17. The circuit of claim 15, wherein the pull-down unit deactivates the internal clock signal in response to an activation of the pulse signal.

18. The circuit of claim 17, wherein the pull-down unit includes a transistor of which electrical conduction is controlled by the pulse signal, the transistor having an electrical conduction path of which one end is grounded and the other end is connected to an output terminal of the driving unit from which the internal clock signal is generated.

* * * * *